United States Patent [19]

Jeuch et al.

[11] Patent Number: 4,544,445
[45] Date of Patent: Oct. 1, 1985

[54] PROCESS FOR POSITIONING AN INTERCONNECTION LINE ON AN ELECTRIC CONTACT HOLE OF AN INTEGRATED CIRCUIT

[75] Inventors: Pierre Jeuch, Seyssins; Jean-Pierre Lazzari, Corenc; Pierre Parrens, Grenoble, all of France

[73] Assignee: Commissariat a l'Energie Atomique, Paris, France

[21] Appl. No.: 590,190

[22] Filed: Mar. 16, 1984

[30] Foreign Application Priority Data

Mar. 18, 1983 [FR] France .................. 83 04472

[51] Int. Cl.⁴ .............. C23F 1/02; B44C 1/22; C03C 15/00; C03C 25/06
[52] U.S. Cl. .................... 156/643; 29/591; 156/644; 156/646; 156/651; 156/656; 156/659.1; 204/192 E; 357/65; 427/88; 430/313; 430/318
[58] Field of Search ............ 156/643, 644, 646, 651, 156/656, 659.1, 662; 204/192 E; 427/88, 89, 90; 29/580, 589, 591; 252/79.1; 430/313, 318; 357/65, 68

[56] References Cited

U.S. PATENT DOCUMENTS

| | | | |
|---|---|---|---|
| 4,062,720 | 12/1977 | Alcorn et al. | 156/643 |
| 4,076,860 | 2/1978 | Kuroda | 156/656 X |
| 4,307,179 | 12/1981 | Chang et al. | 156/659.1 X |

FOREIGN PATENT DOCUMENTS

| | | |
|---|---|---|
| 1806980 | 6/1969 | Fed. Rep. of Germany . |
| 2740757 | 3/1978 | Fed. Rep. of Germany . |
| 2723933 | 6/1978 | Fed. Rep. of Germany . |

OTHER PUBLICATIONS

IBM Technical Disclosure Bulletin, vol. 22, No. 10, Mar. 1980, Chromium as an RIE Etch Barrier, Hitchner et al., pp. 4516–4517.

*Primary Examiner*—William A. Powell
*Attorney, Agent, or Firm*—Michael N. Meller

[57] ABSTRACT

The invention relates to a process for the positioning of an interconnection line on an electric contact hole in an integrated circuit. According to the invention, one or more conductive layers forming a conductive covering are deposited on the complete integrated circuit. The first conductive layer is deposited by an isotropic process. The interconnection line to be produced is then masked by a resin layer, followed by the successive etching of each conductive layer. Finally, an overetching of these conductive layers is effected in the electric contact hole, followed by the elimination of the resin.

11 Claims, 10 Drawing Figures

PROCESS FOR POSITIONING AN INTERCONNECTION LINE ON AN ELECTRIC CONTACT HOLE OF AN INTEGRATED CIRCUIT

The present invention relates to a process for positioning an interconnection line on an electric contact hole of an integrated circuit. This positioning process can in particular be used in the production of MOS (metal-oxide-semiconductor) integrated circuits.

FIG. 1 is a sectional view according to the prior art of a stage in the positioning process of an interconnection line on an electric contact hole of an integrated circuit. The integrated circuit 2 comprises a doped semiconductive active zone 4, corresponding e.g. to the source or drain of a MOS transistor, which is to be electrically connected to another, not shown, active zone of the integrated circuit. Active zone 4 is covered with an oxide layer 6, in which is formed the electric contact hole 7 of zone 4 by chemically etching the oxide layer 6 through an appropriate mask arranged on the layer. The interconnection of active zone 4 and the other active zone of the integrated circuit is brought about by covering the complete integrated circuit with a conductive layer 8, followed by etching of the latter. As layer 8 is of a constant thickness, a cavity is formed above the electric contact hole 7.

To obtain the interconnection line 8a (visible in FIG. 2), on the conductive layer 8 is deposited an insulating layer 10, which is etched so that it only remains in the cavity positioned above the electric contact hole 7. An etching mask is then formed in a resin layer 12. Conductive layer 8 is then etched, e.g. isotropically using a chemical etching process, or anisotropically using a plasma containing compounds such as $CCl_4$. The resins are then eliminated. This gives the interconnection line 8a shown in sectional form in FIG. 2.

This process makes it possible to produce interconnection lines on an electric contact hole without the interconnection lines projecting from the latter.

SUMMARY OF THE INVENTION

The object of the present invention is to simplify this process. The prior art process requires the use of two resin layers. An advantage of the present invention is that only a single resin layer is required. It makes it possible to produce interconnection lines, whose width is no greater than the diameter of the electric contact hole, which increases the integration density.

More specifically, the present invention relates to a process for the positioning of an interconnection line on an electric contact hole of an integrated circuit, wherein, with the electric contact hole formed such that the contact hole edges are substantially perpendicular to the surface of the integrated surface, the following operations are performed:
deposition of at least one conductive layer on the complete integrated circuit, all of these conductive layers forming a conductive covering filling the contact hole and having a substantially planar surface following deposition and in which is produced the interconnection line, the first conductive layer being deposited isotropically;
formation of a resin layer on the conductive covering, so as to mask the interconnection line to be produced;
etching the resin-free part of the conductive covering;
overetching, within the electric contact hole, that part of the conductive covering which is free from resin; elimination of the resin.

The first conductive layer is the lowest layer of the conductive covering and is in direct contact with the bottom of the electric contact hole. Overetching ensures that the free surface of the conductive covering is within the electric contact hole.

According to a preferred embodiment of the process, the conductive covering is constituted by a single conductive layer.

According to another advantageous embodiment, dry etching is used for the etching process of the conductive layer.

According to another preferred embodiment of the process according to the invention, the conductive coating is constituted by a plurality of conductive layers.

According to another preferred embodiment, all the conductive layers are etched by means of the same mask.

According to another advantageous embodiment of the invention, the etching of the first conductive layer is selective with respect to that of the second conductive layer.

According to another advantageous embodiment the etching of the first conductive layer is a dry etching process.

According to an advantageous embodiment, the first layer is a doped semiconductive layer.

According to another preferred embodiment, the conductive covering is constituted by two conductive layers.

According to an advantageous embodiment of the invention, the second conductive layer is a metal layer.

BRIEF DESCRIPTION OF THE DRAWINGS

The invention is described in greater detail hereinafter relative to non-limitative embodiments and with reference to the attached drawings, wherein.

DETAILED DESCRIPTION OF THE INVENTION

Figure 1:
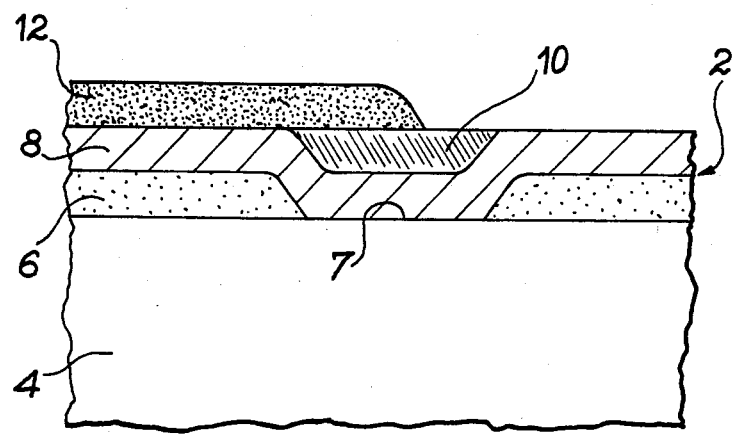
FIGS. 1 and 2, already described, respectively show a stage in the process for positioning an interconnection line on a contact hole of an integrated circuit and the interconnection line obtained by this process, according to the prior art.
Figure 2:
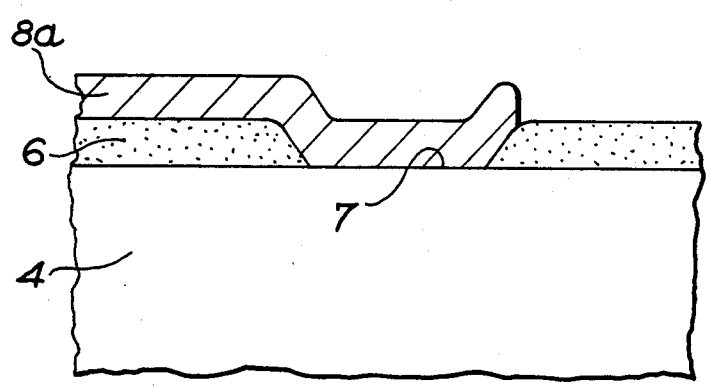
Figure 3A:
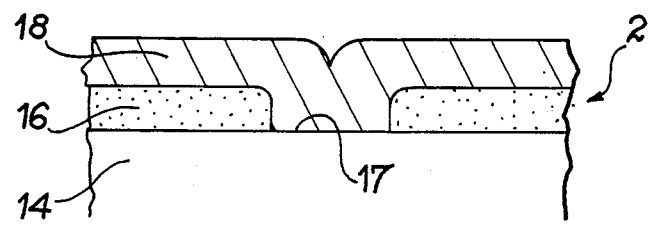
FIGS. 3a to 3d depict, diagrammatically, the different stages of the positioning process according to the invention in the case of a monolayer interconnection line.

FIG. 3a shows part of an integrated circuit having a doped semiconductive active zone 14, corresponding e.g. to the source or drain of a MOS transistor, which is to be electrically connected to another, not shown, active zone of the integrated circuit. Conventionally, active zone 14 is covered with an insulating layer 16, generally of silica, which can contain 5 to 10% phosphorus. This silica layer e.g. has a thickness of 0.8 $\mu m$ and is then etched using a resin mask produced by photolithography on the layer, this being e.g. reactive ionic etching wih $CHF_3$, so as to form the electric contact hole 17 in insulating layer 16.

Following the production of the electric contact hole 17, an isotropic process is used to deposit a conductive layer 18, which is preferably of aluminum, on the complete integrated circuit. Conductive layer 18 has a constant thickness, e.g. of about 1 μm. For example, the isotropic deposition process used can be magnetron sputtering or evaporation with an epicyclic gear. Both these processes are partly isotropic. Thus, in order to fill the electric contact hole 17, the thickness of the conductive layer 18 should exceed the radius of the electric contact hole 17.

Figure 3B:
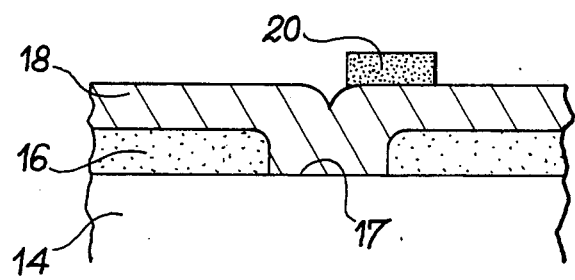

This is followed by the deposition of a photosensitive resin layer 20, in which is produced the image of the interconnection line to be produced in accordance with conventional photolithography processes, i.e. by masking the interconnection line to be produced. The mask of the interconnection line is visible in cross-section in FIG. 3b. The vertical axis of this line and the axis of the contact hole 17 do not coincide. In practice, they can be spaced by approximately 0.4 μm, due to the imprecision of superimposition of the successive masking levels in the case of micron technology.

Figure 3C:
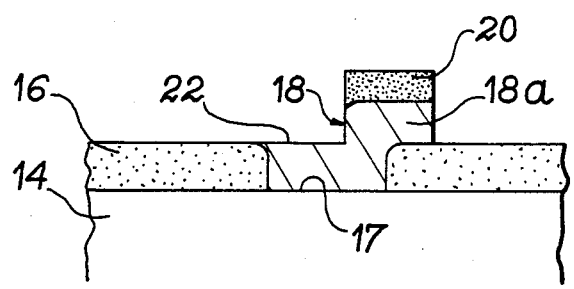
Figure 3D:
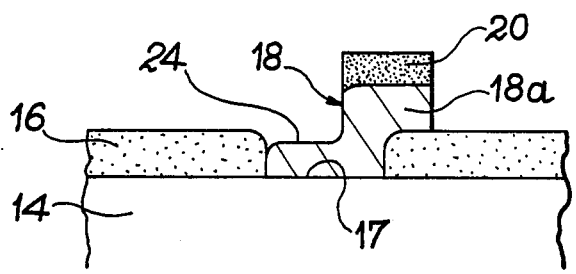

As shown in FIG. 3c, the following stage of the positioning process consists of etching part of the conductive layer 18 which is free from resin layer 20. Preferably, use is made of a dry etching process and this is preferably an anisotropic process, e.g. using a plasma having compounds such as $CCl_4$. This process makes it possible to accurately check the end of etching. It is therefore possible to obtain a very precise overetching of the conductive layer 18, so as to obtain the profile shown in FIG. 3d. This overetching ensures that the surface portion 24 of the remaining conductive layer 18 which is not covered with the resin layer 20 is recessed relative to the surface of insulating layer 16. This overetching ensures a good separation of the conductive lines.

The final stage of the process consists of eliminating the resin layer 20, e.g. by using an oxygen plasma.

This process makes it possible to produce interconnection line widths and electric contact hole diameters of approximately 1 μm for an accuracy of superimposition of the successive mask levels of approximately 0.4 μm.

FIGS. 4a to 4d show another preferred embodiment of the process according to the invention and in these drawings the interconnection line is constituted by two superimposed layers.

Figure 4A:
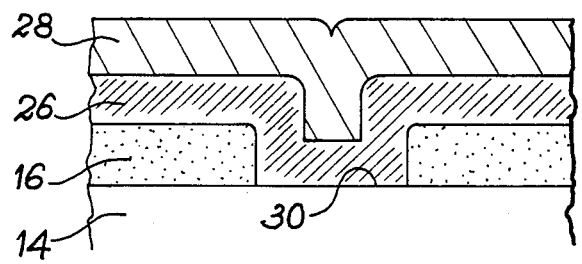
FIGS. 4a to 4d depict, diagrammatically, the different stages of the positioning process according to the invention in the case of a multilayer interconnection line.

FIG. 4a shows part of an integrated circuit having a doped semiconductive active zone 14. It is covered by an insulating layer 16, e.g. of thickness 0.8 μ. Layer 16 is then etched, e.g. anisotropically by reactive ionic etching with $CHF_3$, so as to produce the electric contact hole 30 in insulating layer 16. After forming the electric contact hole 30, a first isotropically deposited conductive layer 26 is placed in a known manner on the complete integrated circuit. According to a preferred way of performing the process, conductive layer 26 is formed with doped polycrystalline silicon of thickness approximately equal to 0.4 μm. The deposition process used is in this case a vapor phase chemical deposition. On conductive layer 26 is deposited a conductive layer 28, which is preferably of aluminum. Conductive layer 28 has a thickness of e.g. approximately 1 μm and can e.g. be deposited by magnetron sputtering.

Figure 4B:
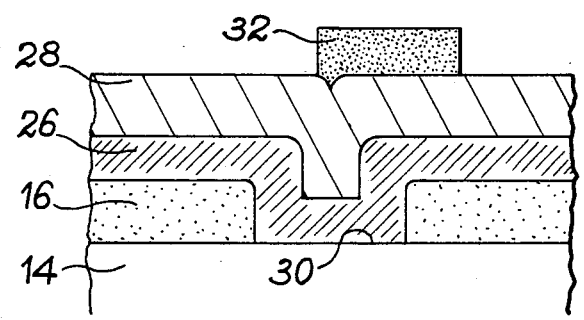

As shown in FIG. 4b, the next stage of the positioning process consists of depositing a resin layer 32, in which is formed the image of the interconnection line to be produced according to conventional photolithography processes, i.e. by masking the interconnection line.

Figure 4C:
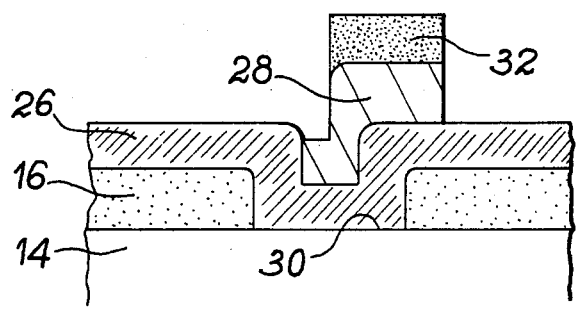
Figure 4D:
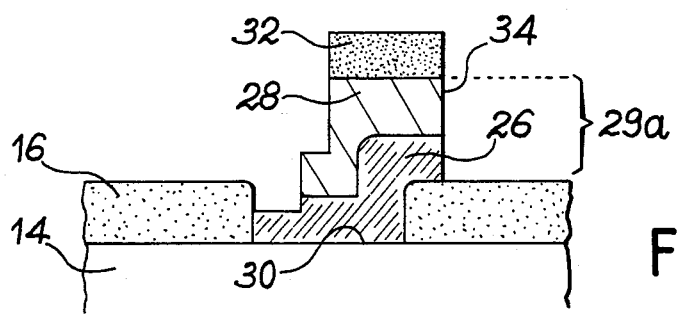

When the resin mask has been produced, it is necessary to etch the two conductive layers to form the interconnection line. The aluminum conductive layer 28 is preferably etched by anisotropic etching using a plasma containing elements such as $CCl_4$. If the first conductive layer 26 does not fill the hole, a preferably slight overetching of conductive layer 28 is carried out in order that its free surface is lower than the free surface of conductive layer 26. FIG. 4c shows a diagrammatic section of the integrated circuit following this etching and overetching.

The next stage is the etching of the conductive layer 26. For this purpose, it is necessary to use a process having little or no effect on conductive layer 28. Thus, the etching of conductive layer 26 is limited to the outside of the contact hole and to the edge thereof, where layer 26 has an increased thickness, due to the isotropic nature of its deposition procedure. In the case of a doped polycrystalline silicon conductive layer 26 and an aluminum conductive layer 28, it is possible to use an etching process employing a plasma containing elements such as $SF_6$, which is an anisotropic etching process. This etching is carried out over the entire thickness of conductive layer 26, a slight overetching then being performed. This leads to an interconnection line covered with a resin layer 32, as is diagrammatically shown in section in FIG. 4d. The final stage of the process consists of eliminating the resin layer 32, e.g. by using an oxygen plasma.

The advantage of an interconnection line produced from two layers, namely a doped semiconductor layer, e.g. of doped polycrystalline silicon, and a metal layer, is the reduction in the contact resistance between the interconnection line and the electric contact hole. Thus, the contact surface, which is equal to the surface of the electric contact hole in the case of an interconnection line with a single layer, is equal in the case of a two-layer interconnection line to the separation surface between the doped semiconductive layer and the metal layer over the entire length of the interconnection line. Another advantage is the elimination of leakage currents which, in the case of a single metal layer interconnection line, are caused by the diffusion of metal atoms into the active zone. Other advantages, such as the elimination of short circuits caused when the electric contact hole is poorly positioned above a junction, through the direct contact between the active zone and the metal layer, are obvious to one having ordinary skill in the art.

What is claimed is:

1. A process for the positioning of an interconnection line on an electric contact hole of an integrated circuit, wherein, with the electric contact hole formed, such that the contact hole edges are substantially perpendicular to the surface of the integrated surface, the following operations are performed:

deposition of at least one conductive layer on the complete integrated circuit, all of these conductive layers forming a conductive covering filling the contact hole and having a substantially planar surface following deposition and in which is produced the interconnection line, the first conductive layer being deposited isotropically;

formation of a resin layer on the conductive covering, so as to mask the interconnection line to be produced;

etching the resin-free part of the conductive covering;

overetching, within the electric contact hole that part of the conductive covering which is free from resin and;

elimination of the resin.

2. A process according to claim 1, wherein the conductive covering is constituted by a single conductive layer.

3. A process according to claim 1, wherein a dry etching process is used for etching the conductive layer.

4. A process according to claim 1, wherein the conductive covering is constituted by a plurality of conductive layers.

5. A process according to claim 4, wherein all the conductive layers are etched by means of the same mask.

6. A process according to claim 4, wherein the etching of the first conductive layer is selective with respect to that of the second conductive layer.

7. A process according to claim 4, wherein the etching of the first conductive layer is a dry etching process.

8. A process according to claim 4, wherein the first conductive layer is a doped semiconductive layer.

9. A process according to claim 4, wherein the conductive covering is constituted by two conductive layers.

10. A process according to claim 9, wherein the second conductive layer is a metal layer.

11. A process according to claim 2, wherein a dry etching process is used for etching the conductive layer.

* * * * *